ROLLING AND BURNISHING OF CONTACT SURFACES

Filed Jan. 7, 1969 5 Sheets-Sheet 1

INVENTORS
G. J. PLICHTA
H. WELLER
BY [signature]
ATTORNEY

ROLLING AND BURNISHING OF CONTACT SURFACES

ROLLING AND BURNISHING OF CONTACT SURFACES

Filed Jan. 7, 1969 5 Sheets-Sheet 5

United States Patent Office 3,606,708
Patented Sept. 21, 1971

3,606,708
ROLLING AND BURNISHING OF CONTACT SURFACES

George J. Plichta, Fords, and Hans Weller, Roselle Park, N.J., assignors to Western Electric Company, Incorporated, New York, N.Y.

Filed Jan. 7, 1969, Ser. No. 789,580
Int. Cl. B24b *1/00*
U.S. Cl. 51—323 3 Claims

ABSTRACT OF THE DISCLOSURE

Method and apparatus for smoothing metal coated surfaces by successive rolling and burnishing operations. The apparatus performs rolling and burnishing operations automatically, using hard polished rollers and a flexible burnishing wheel having automatic compensation for wheel wear. The workpiece is advanced through the rolling and burnishing stations by two opposed conveyor belts which grip the pieces therebetween with the portion to be rolled and burnished protruding to one side of the belts.

BACKGROUND OF THE INVENTION

(1) Field of the invention

This invention relates to methods of providing a smooth metal-plate finish, and in particular, to smoothing electrical contact surfaces such as printed wiring board connector tabs, prior to protective plating with non-corroding metals.

The use of printed wiring has permitted mass production of complex electronic assemblies having high density packaging. However, techniques for establishing reliable connections between different printed wiring boards or external circuitry have lagged behind the techniques for interconnecting components on the same board. Discrete connector sub-assemblies have often been fastened and wired to the printed wiring board to allow use of the printed wiring board as a "plug-in" assembly without sacrificing the reliability and good electrical contact obtained with metal pin connectors. Further improvements in miniaturization and cost reduction have been obtained by making the male portion of the connector integral with the printed wiring board, but it has been difficult to maintain the same excellent electrical contact and long life experienced with separate metal pin connectors.

In manufacturing printed wiring boards having integral connector tabs, the contacts are usually produced by plating a thin layer of copper in the desired wiring and tab pattern, and then applying gold or other precious metal on the copper tab surfaces so that corrosion is prevented. In order to obtain and maintain low contact resistance, the finished tab surface must be smooth so that repeated insertions and removals of the connector do not abrade the precious metal from the "high spots," exposing the copper to corrosive attack.

Production of smooth connector tabs is especially difficult when the printed wiring board is made from a metal plate coated with an insulating resin. Typical coating processes produce a resin coating having an "orange peel" finish. If the wiring and tab are then formed by electroless deposition of copper on a silk screened catalytic ink, the resulting copper surface frequently displays considerable roughness, including sharply protruding nodules. Since manufacturing economy dictates the use of the thinnest copper film having adequate electrical conductivity and mechanical ruggedness, the method used to smooth the tabs should remove as little copper as possible. Further, the method of smoothing should not reduce the tensile strength of the copper or its adhesion to the insulating resin. It is also desirable that any method used to smooth the connector tab surface should leave the copper clean and dry, so that the precious metal plating can be applied without any intervening additional cleaning or drying.

(2) Description of the prior art

Of the various conventional smoothing processes, none have proved satisfactory for high production usage on connector tabs formed by electroless copper deposition on a resin coated metal plate. Hand sanding with a fine abrasive held around a flexible block provides a satisfactory finish, but this process cannot be readily automated. Burnishing with brass wire wheels, buffing with a cloth wheel and compound, or grinding with water cooled, silicon-carbide filled flexible nylon wheels produce a smooth surface; however, the first two techniques tend to create pinholes in the tab, and the buffing compound residue is difficult to rinse from the board; and the latter two techniques often remove as much as half the copper thickness from the tab. Such metal finishing processes as electropolishing, alumina grit blasting and ball peening do not remove the nodules from the connector tab surfaces satisfactorily, and the latter two processes are apt to damage the insulating resin or the tabs themselves. Because of the thinness of the copper layer, grinding with ordinary rigid abrasive wheels is apt to damage the connector tabs directly.

Mechanization of a smoothing method has introduced special problems. Other than hand sanding, the other techniques used or suggested seem readily applicable to automation. However, the material handling techniques previously used are not fully suitable. Use of a standard conveyor having nests or jigs requires care in inserting the workpiece, because the partially procesed unit is not so well protected from mechanical damage or corrosion as a completed printed wiring board. Ordinary conveyor belt systems are not satisfactory, either, since the workpiece must be carefully aligned so that all of the connector tab portion, and only that portion, is treated.

SUMMARY OF THE INVENTION

In accordance with the invention, a method of reducing the surface roughness of metal-coated surfaces is provided wherein the metal coating is smoothed by rolling the surface with a hard smooth wheel, and then burnished with a flexible block or wheel. In another aspect of the invention, there is provided an apparatus for smoothing a selected area of a workpiece, having a rolling station and a burnishing station through which the workpiece is carried in sequence. In the rolling station, one or more pairs of hard smooth rollers bear against opposite sides of the workpiece, one roller at least bearing against the selected area. In the burnishing station one or more flexible blocks or rotating wheels bear against the selected area, while oscillating or rotating rapidly so that a burnishing action is obtained.

When the method of this invention is practiced a great improvement in smoothness can be obtained. For example, connector tabs produced by electroless copper plating on a catalytic ink which has been applied to epoxy insulated steel boards typically show surface finishes, before overplating with precious metal, of 50 to 200 micro-inches with a .010 inch cutoff. After rolling and burnishing, these surfaces are smooth to 30 micro-inches or better. Various features of the disclosed embodiment contribute to these improvements in printed wiring board quality.

The rolling process itself contributes not only to the smoothness of the connector tab surfaces, but also to the mechanical quality of the copper tabs. Preferably, the rolling wheels are heavily spring loaded, and set for a minimum clearance therebetween which is somewhat less than the minimum thickness of the workpiece. The copper connector tabs are compressed during rolling, the insulating coating on the board springing back to its original thickness after passing between the roller wheels. Metallographic evaluation of copper tabs so processed showed no disruption of the grain structure due to depressing the nodules. Measurement of copper test strips showed no loss of adhesion to the epoxy insulation coating resulting from repeated rolling, while the breaking strength of the copper of rolled samples averaged more than 20% greater than samples which had not been rolled.

In the burnishing station, the use of a flexible wheel provides a distributed cutting and polishing action which conforms to the slightly curved surfaces usually found on printed wiring board connector tabs. The use of water coolant prevents the development of hot spots which would degrade the adhesion of the copper to the insulating layer beneath, and also serves to flush copper particles and abrasive dust away from the wheel, eliminating contamination of the surrounding insulating surface.

The use of a flexible burnishing wheel, however, introduces special problems in the burnishing apparatus. Some of the most satisfactory wheel materials such as silicon-carbide filled, nylon mesh wheels having an epoxy binder, or sulfur-free hard rubber, show a very high wear rate. Adjustment for wear of these wheels may be required every two to five minutes because it is desirable that, while being lifted by a printed wiring board from their most advanced position, the wheels not bear for a considerable period of time against the resin coating along the leading edge of the board. If processing through the apparatus had to be stopped every two to five minutes while adjustments were made, the result would be a great drop in work output. The automatic wear compensation provided by this invention affords the desired high production rate without requiring extremely complex tooling.

In order to provide high productivity with workpieces of various sizes and to synchronize the workpiece movement with the rolling wheels, a novel conveying system is also provided. The workpiece is placed on a lower conveyor belt made of a material providing a high coefficient of friction, such as a silicone rubber. The workpiece is aligned, for example, by conventional guidepieces, so that the portion to be treated protrudes from the side of the belt a fixed distance. As the belt and workpiece advance, the workpiece passes beneath an opposed upper belt which presses against the workpiece, so that the area to be treated is held firmly in place with respect to the edge of the lower belt. The surface speed of the rolling wheels is synchronized to that of the belts, so there is no tendency to "cock" the workpiece as it passes between the wheels. The friction grip of the two belts holds the workpiece in line so that the burnishing wheels then engage the desired portion only. Workpieces of different sizes can be accommodated readily by adjusting the alignment of the workpiece on the lower belt.

The invention will be more clearly understood by reference to the following detailed description of an apparatus embodying the principles thereof, in conjunction with the accompanying drawings.

BRIEF DESCRIPTION OF THE DRAWING

FIG. 6 is a schematic front elevation of conveyor and drive systems for the apparatus shown in FIG. 1.

DETAILED DESCRIPTION

Figures 1, 3:
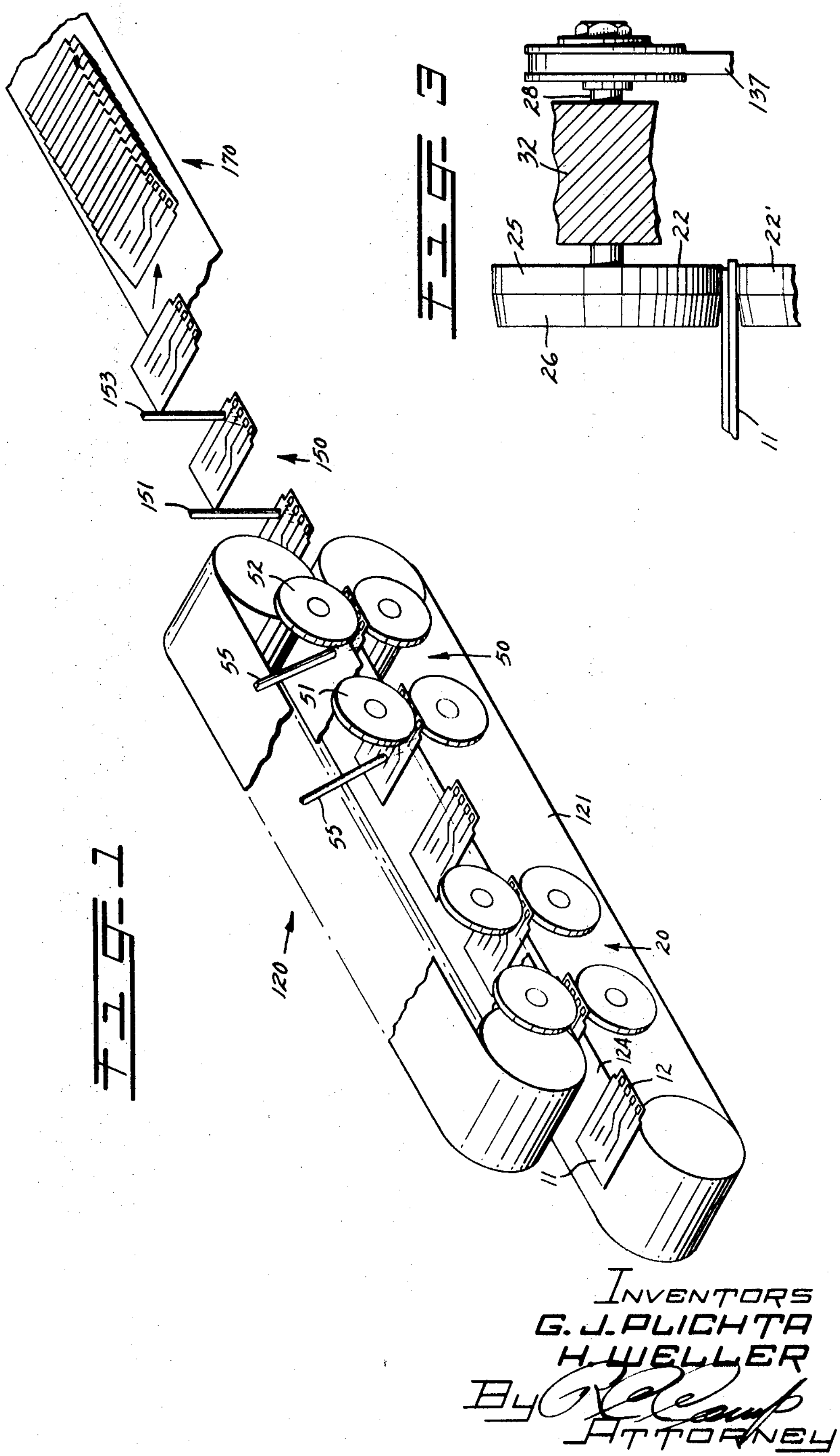
FIG. 1 is a perspective view showing the principal functional elements of a rolling and burnishing apparatus embodying the invention.
FIG. 3 is a partial side elevation of the rolling station.

A rolling and burnishing apparatus embodying the principles of this invention, particularly suited for treating workpieces such as printed wiring boards having integral connector tabs along one edge, is shown schematically in FIG. 1. The apparatus includes an opposed belt assembly 120 for carrying workpieces 11 successively through a rolling station 20 and a burnishing station 50. The workpiece is then passed through a rinsing and drying station 150 and stacked on a shingling conveyor 170.

A typical workpiece 11 would be a printed wiring board having tabs 12 located in a line along one edge of the board and formed from copper deposited simultaneously with the deposition of the printed wiring itself. The workpiece 11 is aligned with respect to the opposed belt assembly 120 by any suitable method, such as the use of conventional adjustable guides, so that the tab portion of the workpiece protrudes a predetermined distance from the edge of the upper run 124 of the lower belt 121, and is in line with the rolling and burnishing wheels.

In the burnishing station 50, water jets 55 flood the exposed connector tab portion with water for cooling and removal of burnishing debris. As shown schematically in FIG. 1, the rinsing and drying station 150 includes a hot water rinsing jet 151 for spraying the area of the printed wiring board which was exposed in the burnishing station 50 to remove any traces of burnishing debris. A compressed air outlet 153, located somewhat downstream from the rinsing jet 151, blows any remaining rinse water from the workpiece so that a clean dry surface is obtained.

Figure 2:
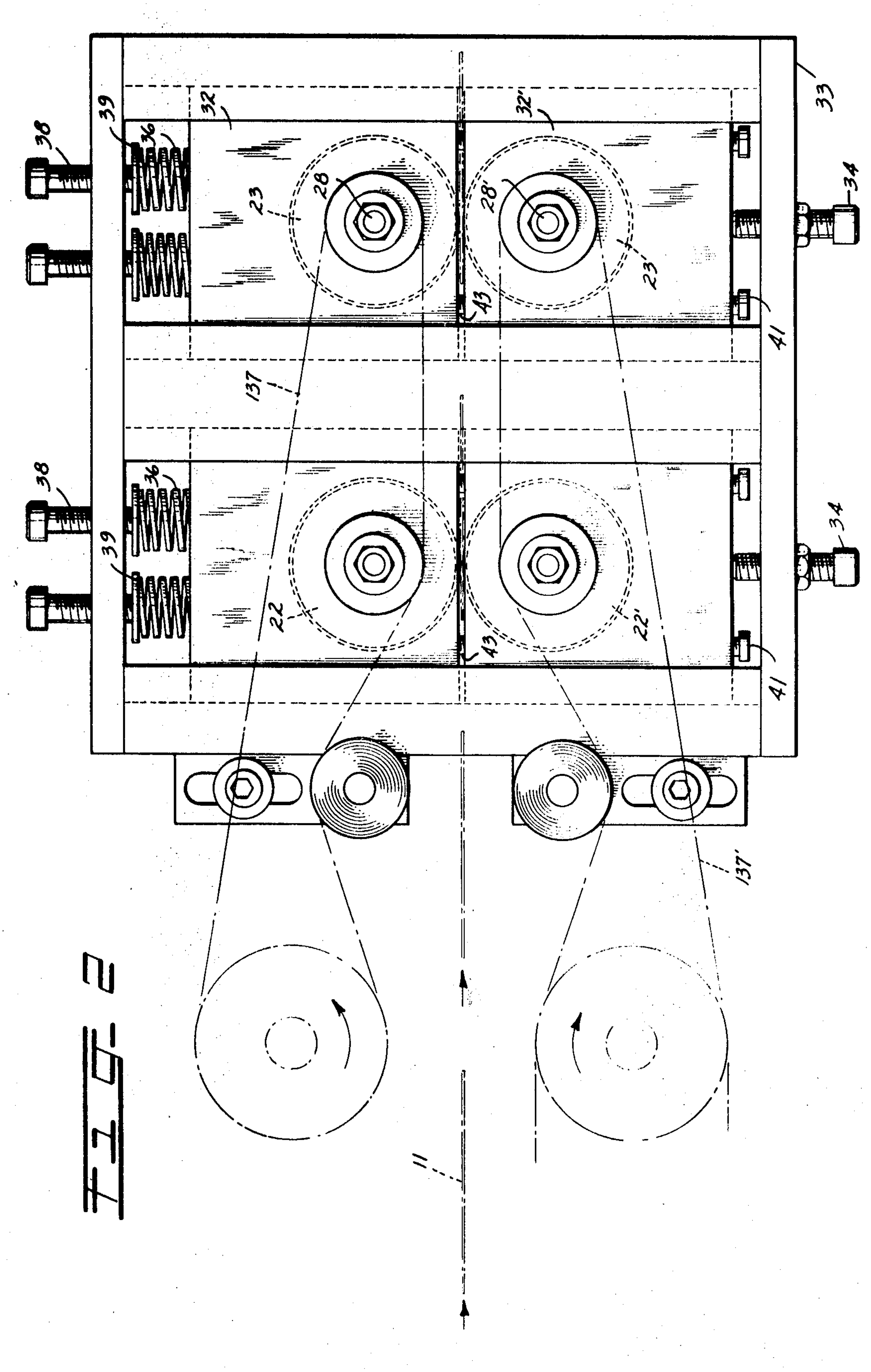
FIG. 2 is a front elevation of the rolling station appearing at the left of FIG. 1.

As shown in FIGS. 2 and 3, the rolling station 20 includes a first upper rolling wheel 22, a second upper rolling wheel 23, and corresponding opposed lower rolling wheels 22' and 23'. The rolling wheels are arranged with their axes transverse to the direction of advancement of the workpiece 11, the axes of the lower rolling wheels being parallel to and directly below the corresponding upper wheels. Each rolling wheel has a principal cylindrical rolling surface 25, of length equal to or slightly greater than the tab 12 to be rolled, and a slightly tapered surface 26 adjoining the principal rolling surface to provide a gradual transition between the portion of the workpiece receiving full rolling pressure, with resultant deformation, and the adjacent unrolled portion.

The upper and lower rolling wheels are secured to shafts 28 and 28' which are rotatably mounted in blocks 32 and 32'. These blocks are slidably mounted in a rolling station frame 33 so as to permit vertical motion of the blocks. Screws 34 projecting upward through threaded holes in the frame 33 are used to adjust the vertical position of the lower blocks 32' to obtain a predetermined height of the wheels 22' and 23' with respect to the undersurface of the advancing workpieces 11. Compression springs 36 press downward against the upper blocks 32 to provide an adjustable rolling force applied through the blocks 32 to wheels 22 and 23. The compression springs 36 are preloaded by adjusting screws 38 which engage threaded holes in the upper portion of the rolling station frame 33 and bear against spring backing plates 39 positioned within the upper coils of the springs. Adjustable stop screws 41 engage vertical threaded holes in the blocks 32', the upper ends 43 of the screws protruding from blocks 32' and engaging the lower surfaces of corresponding blocks 32 for setting the minimum clearance between corresponding wheels 22, 23 and 22', 23' and thus controlling the maximum deformation of the workpiece. In rolling printed wiring boards having a thickness of .055 to .065 inch before applicaton of the printed wiring, settings of .055 inch between wheels 22 and 22', and .050 inch between wheels 23 and 23' have been found to produce good results. A setting of springs 36 to provide a rolling force of 200 to 400 pounds has been found satisfactory using wheels 22, 22' and 23, 23' with diameters of three to four inches and widths of surface 25 from one-quarter to one-half inch.

Figure 4:
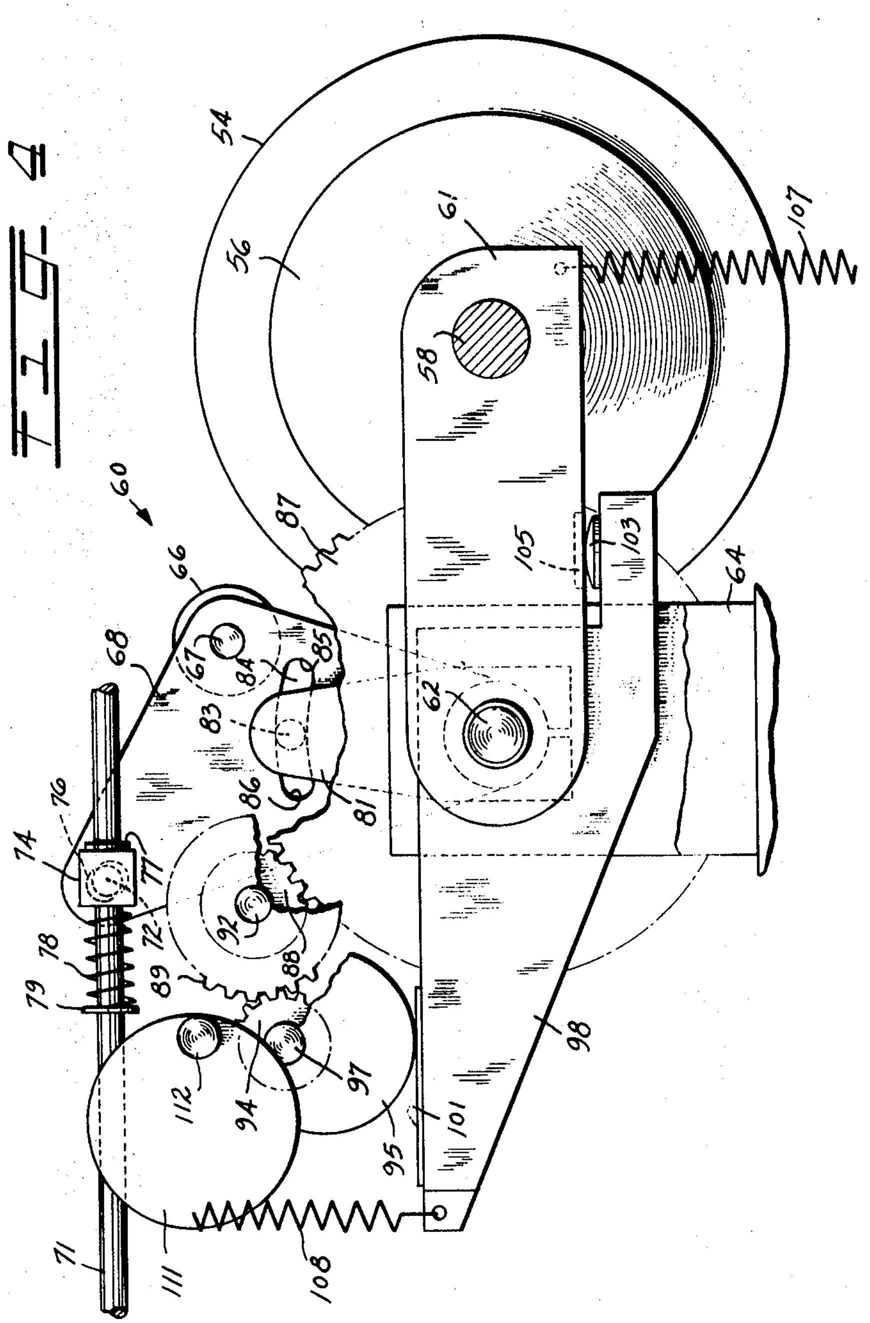
FIG. 4 is a partial front elevation of a compensation mechanism for the burnishing wheels which are shown at the center of FIG. 1.
Figure 5:
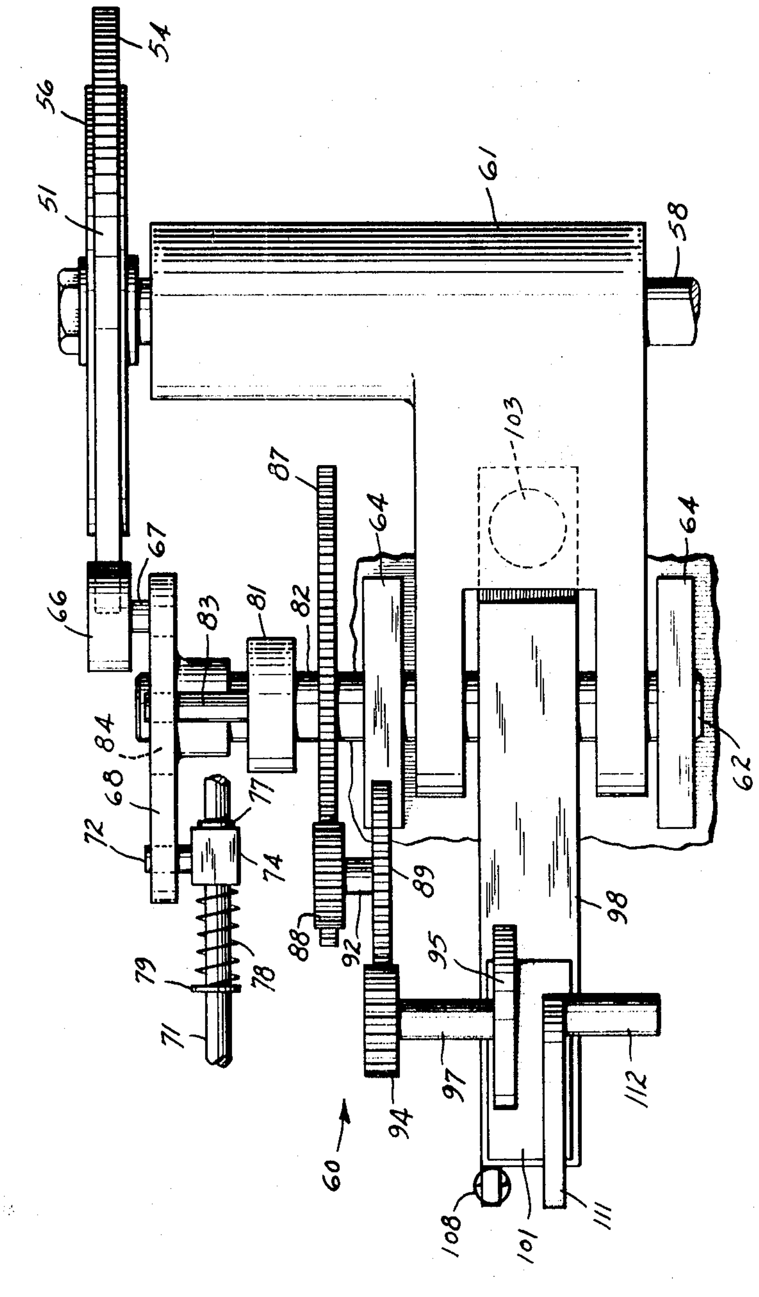
FIG. 5 is a partial plan view of the burnishing wheel compensation mechanism.
Figure 5:
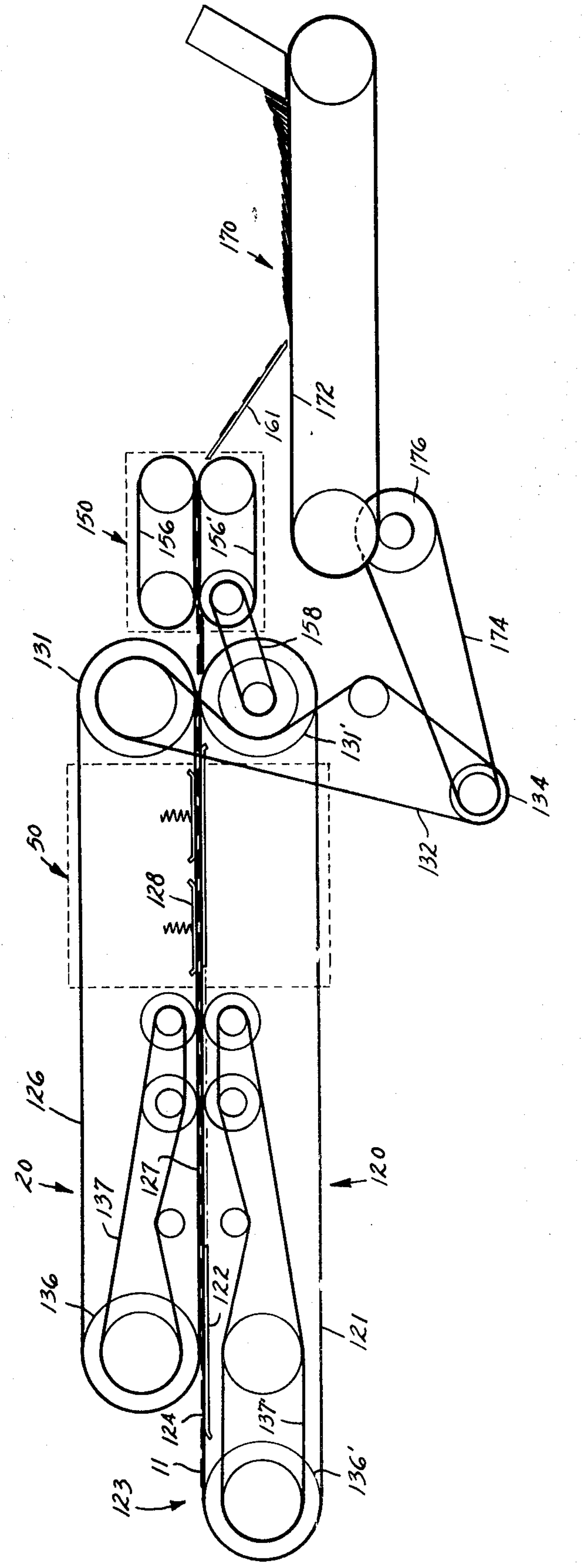

The burnishing station 50, shown schematically in FIG. 1, includes two burnishings wheels 51 and 52 which bear against the tabs 12 in succession as the workpiece 11 is advanced through the burnishing station. As shown in FIGS. 4 and 5, a burnishing wheel includes a thin cylindrical disc 54 clamped between stiffening plates 56 which are fastened on a shaft 58. The disc 54 is made preferably of a silicon-carbide filled flexible material, such as nylon mesh with an epoxy binder, so that the surface in contact with the workpiece will conform to any irregular contours of the workpieces. Normally, the first burnishing wheel 51 utilizes a moderately fine abrasive, while the second burnishing wheel 52 uses a very fine abrasive.

Identical mounting and compensation mechanisms 60, by which the vertical position of each burnishing wheel is compensated for wheel wear, include yokes 61 each pivotally mounted on a pivot shaft 62 which is secured transverse to the direction of workpiece travel in frame portions 64. A burnishing wheel shaft 58 is rotatably mounted in each yoke parallel to the shaft 62, and is driven by conventional means, not shown, such as a belt and pulley arrangement from a countershaft coaxial with the pivot shaft 62, so that rotation of the yoke 61 does not affect the tension or clearances of the drive means.

The compensation mechanism includes a hard carbide measuring wheel 66, rotatably mounted on stub shaft 67 which is fastened to a measuring plate 68 pivotally mounted about the shaft 62, the axis of the wheel 66 and stub shaft 67 being parallel to the shafts 58 and 62. A measuring drive rod 71 common to both compensation mechanisms 60 is reciprocably mounted on the burnishing station frame by means (not shown) to permit longitudinal motion in the direction of workpiece travel. A pin 72, having its axis parallel to the pivot shaft 62, is mounted in a block 74 slidably fitted on the rod 71. The pin 72 protrudes through an elongated hole 76 in the measuring plate 68 so arranged that advancement of the block 74 in the direction of workpiece travel causes the measuring plate 68 to be rotated about the shaft 62 from a normal position until the measuring wheel 66 bears against the surface of the burnishing wheel 51. The block 74 is biased against a fixed stop 77, fastened to the drive rod 71, by a compression spring 78 arranged coaxially about the rod 71 and butting against a spring stop 79 also fastened to the rod 71, so that advancement of the rod 71 beyond the point at which the measuring wheel 66 contacts the burnishing wheel 51 will cause the spring 78 to yield, rather than forcing the measuring wheel to deform the burnishing wheel. The angular position of the measuring plate 68, when the plate and wheel 66 have been so advanced, thus becomes an indication of the present diameter of the burnishing wheel 51.

A pin 83, protruding from the end of a crank arm 81 which is attached to a sleeve 82 rotatably mounted on the pivot shaft 62, passes through a slot 84 in the measuring plate 68. The slot 84 is of such length that, with the crank arm 81 in the position which compensates for the smallest burnishing wheel size to be permitted, the plate 68 may be retracted to its normal position without the leading edge 85 of the slot hitting the pin 83. When the crank arm 81 is in a position corresponding to a burnishing wheel size greater than that installed, as occurs when the burnishing wheel has worn smaller since the last compensation cycle, advancing the plate 68 to bring the measuring wheel 66 into contact with the surface of the burnishing wheel will bring the trailing edge 86 of the slot 84 into contact with the pin 83, and will rotate arm 81 into the position which provides proper compensation, as described below.

The rotation of the crank arm 81 adjusts the position of the yoke 61 through a succession of gears and a compensation cam. A first gear 87 rigidly fixed to sleeve 82 rotates with crank arm 81, and engages a first pinion 88 attached to second gear 89. Pinion 88 and gear 89 rotate together on a countershaft 92 mounted to the burnishing station frame. A second pinion 94, which is engaged by second gear 89, and a compensation cam 95 are fixed to a second countershaft 97 having its axis parallel to pivot shaft 62. The various gear ratios are chosen so that the full range of motion of crank arm 81 results in approximately 180° rotation of cam 95. A compensating lever 98, having a hardened cam follower surface 101 which engages cam 95, is pivotally mounted on shaft 62. A hardened plug 103 protruding from lever 98 engages a mating plate 105 set in the yoke 61, so that rotation of lever 98, in response to rotation of the cam 95 resulting from a decrease in diameter of the burnishing wheel 51 due to wear, lowers yoke 61 and burnishing wheel 51 to keep the bottom edge of the wheel 51 at a predetermined height with respect to the path of travel of the workpiece 11.

A first tension spring 107 connected at one end to the yoke 61 and at its other end to the frame of the burnishing station provides a constant burnishing force when the wheel contacts the workpiece 11 and rises slightly, lifting plate 105 from engagement with plug 103. A second tension spring 108 urges the lever 98 in a direction to hold the cam follower surface 101 against the compensating cam 95 so that the adjustment does not shift except when rotation of the crank arm 81 drives the cam to a new position. To move the burnishing wheel 51 out of engagement with the workpiece 11 there is also provided a disengaging cam 111 fixed to a manually rotatable shaft 112, arranged so that in the "disengagement" position cam 111 bears against follower surface 101 and holds that surface clear of the compensating cam 95, lifting the wheel 51 above the path of travel of the workpiece.

The compensation mechanism may be actuated by any conventional means, such as a solenoid, for advancing the drive rod 71 a sufficient distance to bring the measuring wheel 66 corresponding to each burnishing wheel into contact with the burnishing wheel surface. The compression spring 78 permits each measuring plate 68 to rotate independently of the other. Preferably, actuation of the compensation mechanism is controlled automatically by a conventional self-resetting timer, since the design permits compensation without interruption of the flow of workpieces.

The conveyor systems shown schematically in FIG. 6 include an opposed belt assembly 120 for carrying the workpiece through the rolling and burnishing stations, belts 156 and 156' for carrying the workpiece through the rinsing and drying station 150, and a shingling conveyor 170 for storing treated printed wiring boards.

The opposed belt assembly 120 includes a lower opposed continuous conveyor belt 121 which passes through a loading station designated generally as 123, the rolling station 20 and the burnishing station 50. A suitable backing plate 122 under the upper run 124 of the belt 121, attached to the frame of the apparatus (not shown), maintains the upper surface of the belt horizontal and provides a reference for adjusting the vertical positions of the rolling wheels 22' and 23' and the burnishing wheels 51 and 52. An upper opposed continuous conveyor belt 126 passes through the rolling and burnishing stations, the outer surface of the lower run 127 of belt 126 being parallel to and in close proximity to the upper surface of the upper run 124 of the lower belt 121. Pressure shoes or rollers 128 are arranged to press the lower run 127 downward within the burnishing station 50, so that a workpiece which has been placed on the lower belt 121 will be gripped firmly between the belts 121 and 126 as the workpiece is engaged by the burnishing wheels 51 and 52.

Opposed belts 121 and 126 are driven conventionally by wheels 131 and 131' which are thermselves driven by a main drive belt 132 from a main drive pulley 134 operated by a suitable motor (not shown). Tension in the belts 121 and 126 is established by adjusting the longitudinal position of driven wheels 136 and 136', respectively, located at the loading station ends of the belts. Rolling station drive belts 137 and 137' are driven conventionally from the wheels 136 and 136' to provide driving power to the rolling wheels 22, 23 and 22', 23', respectively.

The workpieces 11 are conveyed through the rinsing and drying station 150 by upper and lower rinsing and drying conveyor belts 156 and 156' having their respective lower and upper runs parallel and in close proximity, similar to the belts 121 and 126. The lower belt 156' is driven conventionally by a drive belt 158 from the lower drive wheel 131' of the opposed belt assembly 120, while the upper belt 156 is driven through frictional contact between its lower run and the upper run of belt 156' or the workpiece 11 gripped therebetween.

A conventional shingling conveyor 170 receives workpieces 11 as they slide down a ramp 161 from the rinsing and drying station 150 and stacks them so that they can be removed in convenient groups. The shingling conveyor includes a shingling belt 172 driven intermittently from the main drive pulley 134 by a shingling drive belt 174 and an electrically operated clutch 176. The clutch 176 is actuated by a switch (not shown), in response to the delivery of a workpiece 11 from the rinsing and drying station 150, such that the shingling belt 172 advances a distance less than the length in the direction of travel of one workpiece 11 so that the workpieces overlap and can be formed conventionally into a tilted stack at the end of the shingling belt.

In operating the rolling and burnishing apparatus, an operator places workpieces 11 one at a time on the surface of lower opposed belt 121 in the loading station 123, such that the connector tab portion overhangs the edge of belt. As the belt advances continuously the workpiece 11 passes under the upper opposed belt 126 to be held while advancing through the rolling and burnishing stations. The connector tab portion of the workpiece 11 is carried successively between rolling wheels 22, 22' and 23, 23' for progressive smoothing of the copper tabs. As the workpiece 11 is carried into the burnishing station, it arrives at the place where the pressure shoes 128 urge the two belts together so that the workpiece is gripped tightly to prevent movement relative to the opposed belts. As the connector tab portion is carried under the burnishing wheels 51 and 52, the portion being treated is flooded with water for cooling and removal of the burnishing debris.

As the workpiece 11 passes from the burnishing station 150, it is received by the rinsing and drying conveyor belts 156 and 156' and is held therebetween, with the portion previously rolled and burnished being exposed. The workpiece is first rinsed with hot water to remove all traces of debris resulting from the previous treatment and then passes under a compressed air blast which blows off any remaining water, leaving the workpiece dry. Leaving the rinsing-drying station 150, the workpiece is released to slide down ramp 161 onto the shingling conveyor 170. On arriving at the bottom of the ramp 161, the presence of the workpiece 11 operates the switch which energizes clutch 176 to advance the shingling belt 172 one step.

It will be understood by those skilled in the art that surfaces on opposite sides of a workpiece can be burnished simultaneously by provision of additional burnishing wheels pressing upward against the workpiece and that the choice of one or more stages of rolling wheels and one or more stages of burnishing wheels will be made according to characteristics of the workpiece and the quality of surface required. According to the characteristics of the workpiece, flexible burnishing materials which contain no discrete abrasive particles may also prove advantageous.

What is claimed is:

1. A method of reducing the surface roughness of a thin coating of metal formed on an epoxy-coated board which comprises the step of:

smoothing an exposed surface of the metal coating by rolling the surface with a smooth surfaced wheel, biased against said surface with a force of from 400 to 1600 pounds per inch of wheel width.

2. The method of claim 1 which comprises the additional step of:

burnishing the rolled surface with a material more flexible than the metal coating on the workpiece.

3. A method according to claim 2, wherein said step of burnishing includes engaging the rolled surface with a rotating wheel having very fine abrasive particles embedded in a material more flexible than the metal coating on the workpiece.

References Cited

UNITED STATES PATENTS

| | | | |
|---|---|---|---|
| 229,527 | 7/1880 | Duffy | 51—5 |
| 488,499 | 12/1892 | Hollingshead | 204—36X |
| 1,835,636 | 12/1931 | Corbit | 204—36X |
| 2,338,049 | 12/1943 | Murray | 204—36X |
| 2,913,853 | 11/1959 | Solem | 51—5 |

LESTER M. SWINGLE, Primary Examiner

U.S. Cl. X.R.

29—90; 51—5; 204—36